(12) United States Patent
Kim et al.

(10) Patent No.: US 6,812,567 B2
(45) Date of Patent: Nov. 2, 2004

(54) SEMICONDUCTOR PACKAGE AND PACKAGE STACK MADE THEREOF

(75) Inventors: Jin-Ho Kim, Suwon (KR); Se-Yong Oh, Yongin (KR)

(73) Assignee: Samsung Electronics Co., Ltd., Kyunggi-do (KR)

( * ) Notice: Subject to any disclaimer, the term of this patent is extended or adjusted under 35 U.S.C. 154(b) by 0 days.

(21) Appl. No.: 10/660,539

(22) Filed: Sep. 12, 2003

(65) Prior Publication Data

US 2004/0104474 A1 Jun. 3, 2004

(30) Foreign Application Priority Data

Nov. 28, 2002 (KR) .................................. 10-2002-74752

(51) Int. Cl.$^7$ ........................ H01L 23/48; H01L 21/44
(52) U.S. Cl. ...................... 257/734; 257/737; 438/617; 438/116
(58) Field of Search ............................... 257/737, 778, 257/698, 685, 678; 438/617, 629, 619, 112, 116, 109

(56) References Cited

U.S. PATENT DOCUMENTS 5,173,766 A * 12/1992 Long et al. ................. 257/687
5,674,785 A * 10/1997 Akram et al. .................. 438/15
6,097,087 A * 8/2000 Farnworth et al. .......... 257/698
6,555,917 B1 * 4/2003 Heo ............................ 257/777

FOREIGN PATENT DOCUMENTS

| KR | 1019950014678 | 12/1995 |
| KR | 1019990243555 | 11/1999 |

* cited by examiner

Primary Examiner—Long Pham
Assistant Examiner—(Vikki) Hoa B. Trinh
(74) Attorney, Agent, or Firm—Harness, Dickey & Pierce, P.L.C.

(57) ABSTRACT

A semiconductor package comprises a board, a plurality of solder bump pads, a plurality of board pads, a plurality of distribution patterns, a plurality of contact pads, at least one chip, a plurality of bonding wire, an encapsulation part and a plurality of solder bumps. In order to reduce the height of the loop of the bonding wires for connecting the bonding pad on the semiconductor chip to the board pads on the board, the ends of the bonding wires are connected to the bonding pads and board pads respectively by wedge bonding. Thus, a very thin package can be obtained. In addition, a thin package stack can be obtained by stacking the very thin packages.

14 Claims, 3 Drawing Sheets

SEMICONDUCTOR PACKAGE AND PACKAGE STACK MADE THEREOF

CROSS REFERENCE TO RELATED APPLICATIONS

This U.S. non-provisional application claims priority under 35 U.S.C. §119 to Korean Patent Application No. 2002-74752 filed Nov. 28, 2002, the entire contents of which are incorporated by reference.

BACKGROUND OF THE INVENTION

1. Field of the Invention

The present invention relates to a semiconductor package and a package stack made thereof.

2. Description of the Prior Art

The electronic industry continues to seek products that are lighter, faster, smaller, multi-functional, more reliable and more cost-effective. In order to meet the requirement of the electronic industry, circuit chips should be more highly integrated.

However, increasing the density of integration of chips may be expensive and have technical limitations. Therefore, three-dimensional (3-D) type semiconductor packaging techniques have been developed and used. In general, package stacks made by stacking a plurality of packages and stacked chip packages made by stacking a plurality of chips in a package have been used.

Package stacks may be manufactured by stacking packages that have already passed the necessary tests for their functions. Therefore, the yields and reliability of these package stacks may be higher than those stacked chip packages manufactured by stacking a plurality of chips without being tested. However, the package stacks may be thicker as compared with stacked chip packages, because of the thickness of each individual stacked package.

SUMMARY OF THE INVENTION

Exemplary embodiments of the invention provide a thinner semiconductor package, and a package stack using the thinner semiconductor package.

Exemplary embodiments of the invention also provide a semiconductor package, a package stack, a method of manufacturing a semiconductor package, and a method of manufacturing a package stack where one or more ends of one or more bonding wires are bonded to pads, such as bonding pads and/or board pads, using wedge bonding.

Exemplary embodiments of the invention also provide a semiconductor package, a package stack, a method of manufacturing a semiconductor package, and a method of manufacturing a package stack where two or more of solder bump pads, solder bumps, and an encapsulation part are provided on the same side of a board. In other exemplary embodiments, there are one or more solder bump pads, solder bumps, and/or encapsulation parts. In other exemplary embodiments, the side of the board is a lower side.

Exemplary embodiments of the invention also provide a semiconductor package, a package stack, a method of manufacturing a semiconductor package, and a method of manufacturing a package stack where two or more of solder bump pads, solder bumps, and an encapsulation part are provided on the same side of a board and where one or more ends of one or more bonding wires are bonded to pads, such as bonding pads and/or board pads, using wedge bonding.

An exemplary embodiment of the invention provides a semiconductor package comprising a board, a plurality of solder bump pads, a plurality of board pads, a plurality of wiring patterns, a plurality of contact pads, at least one chip, a plurality of bonding wires, an encapsulation part and a plurality of solder bumps.

The board may have an aperture, and the semiconductor chip may be installed in the aperture. The solder bump pads and the board pads may be formed on the lower surface of the board, and the solder bump pads may be electrically connected to board pads using the wiring patterns. The bonding pads may be formed on the semiconductor chip, and electrically connected to the board pads using the bonding wires. In order to reduce the height of loop of the bonding wires, both ends of the bonding wires may be attached to the bonding pads and the board pads by a wedge bonding.

The semiconductor chip, the bonding pads and the bonding wires may be encapsulated for protection. The contact pads may be formed on the upper surface of the board, and electrically connected to the solder bump pads by via holes.

The encapsulation part generally extends below the lower surface of the board. The height of each solder bump may be greater than the distance that the encapsulation part extend below the lower surface of the board.

The board may be covered with a solder resist except for the regions over the solder bump pads, the contact pads and the board pads.

A package stack according to an exemplary embodiment of the invention may be made by stacking the packages described above.

In the package stack according to an exemplary embodiment of the invention, the solder bumps of an upper package of any two adjacent packages may be electrically connected to the contact pads of the lower package of the two adjacent packages respectively.

DETAILED DESCRIPTION OF EXEMPLARY EMBODIMENTS

Exemplary embodiments of the invention will be described below with reference to the accompanying drawings.

Figure 1:
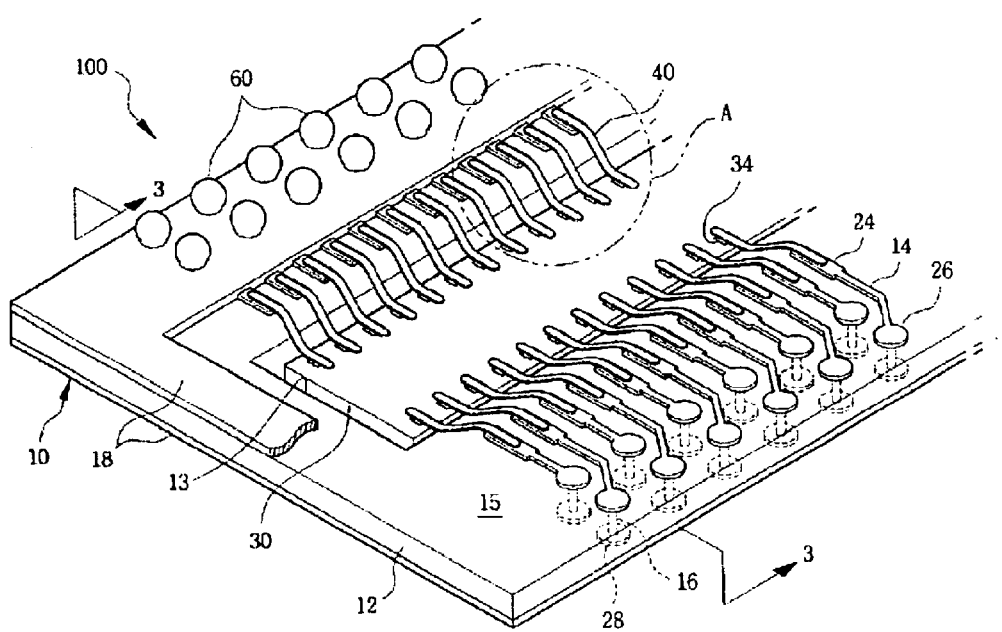
FIG. 1 is a perspective view of a semiconductor package according to an exemplary embodiment of the invention.
Figure 2:
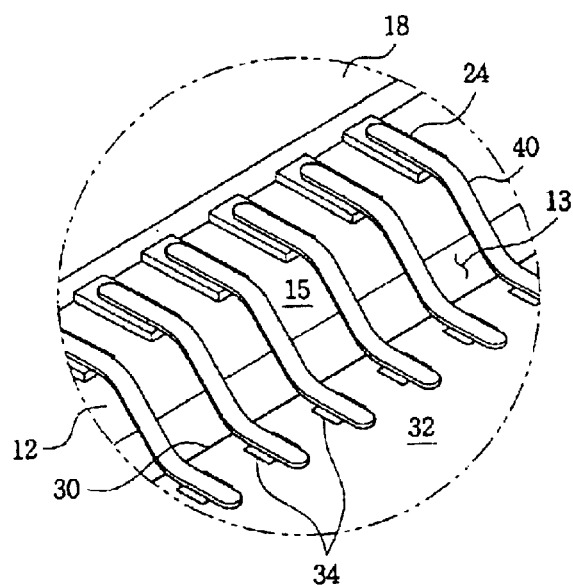
FIG. 2 is an enlarged view of the encircled part A in FIG. 1

The structure of a semiconductor package (100) according to an exemplary embodiment of the invention will be described referring to FIG. 1~FIG. 3. In FIG. 1 and FIG. 2, an encapsulation part (50) shown in FIG. 3 is not shown for convenience of explanation.

Figure 3:
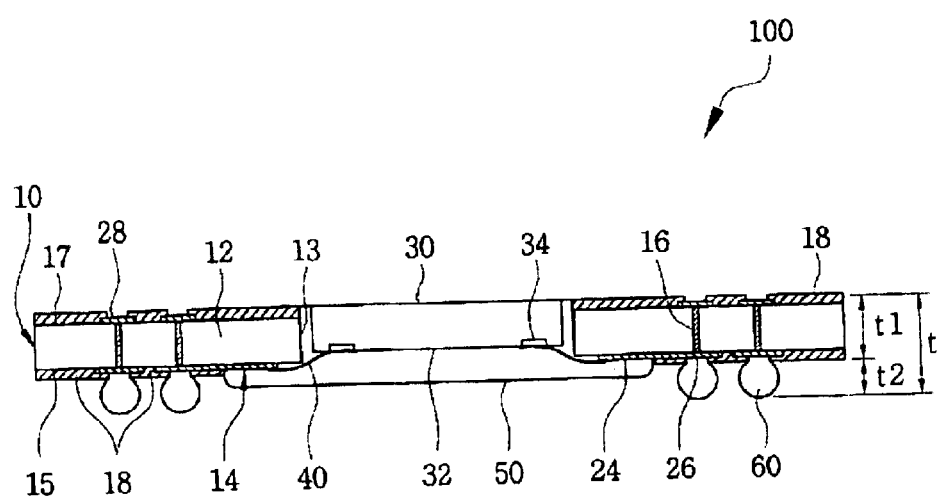
FIG. 3 is a cross-sectional view of the cross section taken along 3—3 in FIG. 1.

Referring to FIG. 1~FIG. 3, a semiconductor package according to an exemplary embodiment of the invention comprises a semiconductor chip (30), a board (10) and an electrical connector between the chip (30) and the board (10).

More specifically, the board (10) may comprise an upper surface (17), a lower surface (15) and an aperture (13) formed in a central region of the board (10). In FIG. 1, the package (100) is illustrated with the lower surface (15) of the board (10) upward.

In other exemplary embodiments, the board (10) may contain more than one aperture (13) and the aperture or apertures (13) may be located anywhere in the board (10).

The board (10) may be a printed circuit board having a body (12) and wiring patterns (14) formed on the body (12). The body (12) of the board (10) may be manufactured by using materials such as glass-epoxy resin or BT resin. The wiring patterns (14) may be formed by attaching thin copper foil on the board (10), then patterning the copper foil.

A plurality of solder bump pads (26) may be formed on the lower surface (15) of the board (10) and electrically connected to the outer ends of the wiring patterns (14). A plurality of board pads (24) may be formed on the lower surface (15) of the board (10) near the aperture (13), and electrically connected to the other ends of the wiring patterns (14). Therefore, the board pads (24) may be electrically connected to the solder bump pads (26) one-to-one.

A plurality of contact pads (28) may be formed on the upper surface (17) of the board (10), and electrically connected to the solder bump pads (26) one-to-one by via holes (16) formed through the board (10). The via holes (16) may be made by making holes through the body (12) of the board (10), plating the inside surfaces of the holes with conductive materials such as Cu, then filling the holes with a low temperature melting metal such as solder.

Solder resist layers (18) may be formed on the upper surface (17) and the lower surface (15) of the body (12) in order to protect the body (12) and the wiring patterns (14). However, the solder resister layers (18) need not cover the areas over the aperture (13), the solder bump pads (26), the contact pads (28) and the board pads (24). The solder resist layer (18) formed on the lower surface (15) may play a role of preventing the liquid molding resins such as Epoxy Molding Compound (EMC) from flowing over the lower surface (15) of the board (10) during the molding process.

A plurality of bonding pads (34) may be formed on the active surface of semiconductor chip (30). The semiconductor chip (30) may be disposed in the aperture (13) in the board (10) in such a manner that the active surface of the semiconductor chip (30) faces the same direction as the lower surface (15) of the board (10). The bonding pads (34) may be electrically connected to the board pads (24) by bonding wires (40). Each of the bonding wires has one end connected to one of the bonding pads (34) and the other end connected to one of the board pads (24) respectively by wedge bonding. Metals such as Au, Al or Cu may be used for making the bonding wires (40). By using wedge bonding at both ends of each bonding wire, it may be possible to control the maximum height of the loop of each bonding wire (40) within 0.05 mm. Using the conventional ball bonding method, it may be very difficult to control the maximum height of the loop of each bonding wire (40) within 0.05 mm. In general, the wedge bonding may be carried out by an ultrasonic wedge bonding process or a thermosonic wedge bonding process. The ultrasonic wedge bonding process is a low temperature process (typically at ambient temperature) in which the welding is accomplished by force and ultrasonic energy. The thermosonic wedge bonding process is basically identical to the ultrasonic wedge bonding process, except for the additional step of component heating.

An encapsulation part (50) may be formed by filling the aperture (13) with a liquid molding resin, such as EMC. The liquid molding resin filling the aperture (13) becomes the encapsulation part (50) after it is cooled. The semiconductor chip (30), the bonding wires (40) and the board pads (24) are protected by the encapsulation part (50). The solder resist layer (18) formed on the lower surface (15) of the board (10) may prevent the liquid resin from flowing over entire area of the lower surface (15) of the board (10).

During the semiconductor chip installation process and the encapsulation process, adhesive tape may be attached to the upper surface (17) of the board (10), thereby closing the aperture (13) on the upper surface (17) of the board (10). During the manufacturing process, the semiconductor chip (30) may be supported by the adhesive tape. The adhesive tape may be removed from the board (10) after the encapsulation process is finished. The inactive surface of the semiconductor chip (30) may be exposed to outside of the semiconductor package (100) in order to reduce the thickness of the package and to enhance the cooling effect of the semiconductor chip (30).

A plurality of solder bumps (60) are formed on the solder bump pads (26) respectively. In general, the solder bumps (60) may be made by reflowing the solders disposed on the solder bump pads (26).

According to an exemplary embodiment of the invention, the solder bumps (60) may be formed on the lower side of the board (10) in order to reduce the thickness of the package (100), because the encapsulation part (50) generally extends out of the board (10).

It may be possible to make the thickness (t1) of the board (10) less than 0.12 mm, and to make the thickness (t2) of the solder bump (60) less than 0.08 mm. Therefore, it may also be possible to make the total thickness (t) of the package (100) less than 0.2 mm.

Figure 4:
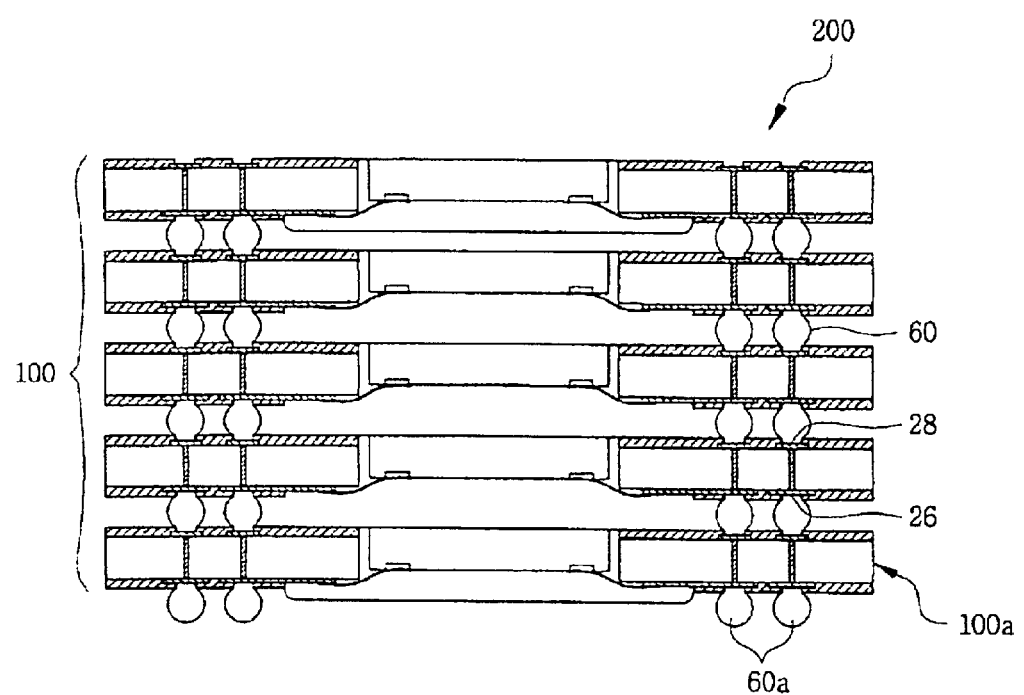
FIG. 4 is a cross-sectional view of a package stack made of a plurality of the semiconductor packages according to an exemplary embodiment of the invention.

By stacking the packages (100) according to an exemplary embodiment of the invention, it may be possible to obtain a thinner package stack. FIG. 4 is a cross sectional view of an exemplary embodiment of the invention showing a package stack made by stacking the packages (100).

According to FIG. 4, the package stack (200) is made by stacking five packages (100) 3-dimensionally. The solder bumps (60) of the upper package of any two adjacent packages are electrically connected to the contact pads (28) of the lower package of the two adjacent packages by reflowing the solder bumps. The solder bumps (60a) of the lowest package (100a) are generally used for outer terminals. In order to stack the packages 3-dimensionally, the solder bump pads (26) of the upper package of any two adjacent packages may be aligned with the contact pads (28) of the lower package.

Because the thickness of each package (100) including the solder bumps may be less than 0.2 mm, it may be possible to make the thickness of the package stack (200) less than 1.0 mm. Although an exemplary embodiment of the invention has been described with reference to five stacked packages, it is obvious to those of ordinary skill that the number of packages is not so restricted.

According to exemplary embodiments of the invention, it may be possible to obtain a thinner semiconductor package by connecting the semiconductor chip to the board using the wedge bonding method, and by forming the solder bumps on the lower side of the board where the encapsulation part is formed.

While the present invention has been particularly shown and described with reference to certain exemplary embodiments, it should be understood by those skill in the art that the scope of the present invention is defined by the claims provided below and is not restricted to the exemplary embodiments, and that various changes in form and details may be made without departing from the spirit and the scope of the invention.

What is claimed is:

1. A semiconductor package, comprising:
   a board having an upper surface, a lower surface and an aperture;
   a plurality of solder bump pads formed on the lower surface of the board;
   a plurality of board pads formed on the lower surface of the board;
   a plurality of distribution patterns for electrically connecting the solder bump pads to the board pads;
   a plurality of contact pads formed on the upper surface of the board, and electrically connected to the solder bump pads;
   at least one chip having a plurality of bonding pads, disposed in the aperture;
   a plurality of bonding wires electrically connecting the bonding pads to the board pads, at least one end of the bonding wires being bonded to the bonding pads or the board pads by wedge bonding;
   an encapsulation part provided on the lower surface of the board for encapsulating the at least one chip, the plurality of bonding wires and the plurality of board pads; and
   a plurality of solder bumps formed on the plurality of solder bump pads.

2. The semiconductor package according to claim 1, wherein the height of each solder bump is greater than the height of the encapsulation part extending over the lower surface of the board.

3. The semiconductor package according to claim 1, wherein the board is covered with a solder resist except for the regions above the plurality of solder bump pads, the plurality of contact pads and the plurality of board pads.

4. The semiconductor package according to claim 1, further comprising:
   a plurality of via holes formed through the board for electrically connecting the solder bump pads to the contact pads.

5. A package stack including a plurality of the semiconductor packages according to claim 1,
   wherein at least one solder bump of an upper package of any two adjacent packages is electrically connected to at least one contact pad of the lower package of the two adjacent packages.

6. A method of manufacturing a semiconductor package, comprising:
   forming a plurality of solder bump pads on one surface of a board;
   forming a plurality of board pads on the one surface of the board;
   placing at least one chip having a plurality of bonding pads in an aperture of the board;
   forming a plurality of contact pads on a surface of the board opposite the one surface of the board, the plurality of contact pads being electrically connected to corresponding ones of the plurality of solder bump pads;
   wedge bonding at least one end of a plurality of bonding wires to electrically connect the bonding pads to the plurality of board pads;
   encapsulating the at least one chip, the plurality of bonding wires and the plurality of board pads on the one surface of the board; and
   forming a plurality of solder bumps on the plurality of solder bump pads.

7. The method of claim 6,
   wherein the height of each solder bump is greater than the height of the encapsulation part extending over the one surface of the board.

8. The method of claim 6, wherein at least one solder bump of an upper package of any two adjacent packages is electrically connected to at least one contact pad of the lower package of the two adjacent packages.

9. The method of claim 6, wherein the semiconductor package includes
   the board having an upper surface, a lower surface and the aperture;
   the plurality of solder bump pads formed on the lower surface of the board;
   the plurality of board pads formed on the lower surface of the board;
   the plurality of distribution patterns for electrically connecting the solder bump pads to the board pads;
   the plurality of contact pads formed on the upper surface of the board, and electrically connected to the solder bump pads;
   the at least one chip having the plurality of bonding pads, disposed in the aperture;
   the plurality of bonding wires electrically connecting the bonding pads to the board pads;
   the encapsulation part provided on the lower surface of the board for encapsulating the at least one chip, the plurality of bonding wires and the plurality of board pads; and
   the plurality of solder bumps formed on the plurality of solder bump pads.

10. A method of manufacturing a semiconductor package, comprising:
    forming a board having an upper surface, a lower surface and an aperture;
    forming a plurality of solder bump pads on the lower surface of the board;
    forming a plurality of board pads on the lower surface of the board;
    placing a semiconductor chip in the aperture, the semiconductor chip having a plurality of bonding pads arrayed on an active surface and the aperture being sized to expose substantially all of the active surface;
    forming a plurality of contact pads on the upper surface of the board, the contact pads being electrically connected to corresponding ones of the solder bump pads;
    wedge bonding at least one end of a plurality of bonding wires to electrically connect the bonding pads to the plurality of board pads;
    encapsulating the active surface of semiconductor chip, the bonding pads, the bonding wires and the board pads; and
    forming a plurality of solder bumps on the plurality of solder bump pads.

11. A method of manufacturing a semiconductor package according to claim 10, wherein:
    the bonding pads are arranged in a double row configuration.

12. A method of manufacturing a semiconductor package according to claim 11, wherein:
    each of the rows of bonding pads are positioned in peripheral regions of the active surface.

13. A method of manufacturing a semiconductor package according to claim 10, further comprising:

forming a plurality of connective vias through the board to provide electrical contact between the contact pads and the corresponding ones of the solder bump pads.

14. A method of manufacturing a semiconductor package according to claim 10, further comprising:

forming an insulating layer on a peripheral portion of the lower surface of the board;

wherein the bonding wires are configured to remain below a plane defined by an exposed surface of the insulating layer.

* * * * *